United States Patent
Li et al.

(10) Patent No.: US 11,604,291 B2
(45) Date of Patent: Mar. 14, 2023

(54) FLAT PANEL DETECTOR AND DRIVING METHOD THEREOF

(71) Applicant: BOE Technology Group Co., Ltd., Beijing (CN)

(72) Inventors: Zeyuan Li, Beijing (CN); Jiangbo Chen, Beijing (CN); Fanli Meng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/352,962

(22) Filed: Jun. 21, 2021

(65) Prior Publication Data

US 2022/0146697 A1 May 12, 2022

(30) Foreign Application Priority Data

Nov. 10, 2020 (CN) .......................... 202011248017.0

(51) Int. Cl.
*G01T 1/24* (2006.01)
*H01L 27/146* (2006.01)
*H04N 5/341* (2011.01)

(52) U.S. Cl.
CPC ........ *G01T 1/241* (2013.01); *H01L 27/14612* (2013.01); *H04N 5/341* (2013.01)

(58) Field of Classification Search
CPC .... H01L 27/14612; H04N 5/341; G01T 1/241
See application file for complete search history.

(56) References Cited

U.S. PATENT DOCUMENTS

| | | | |
|---|---|---|---|
| 2004/0065840 A1* | 4/2004 | Morishita | ......... H01L 27/14609 250/370.11 |
| 2019/0187300 A1* | 6/2019 | Kim | ...................... G01T 1/2018 |

* cited by examiner

*Primary Examiner* — David P Porta
*Assistant Examiner* — Fani Polyzos Boosalis
(74) *Attorney, Agent, or Firm* — Workman Nydegger

(57) ABSTRACT

The present disclosure provides a flat panel detector and a driving method thereof. A detection unit includes: a first transistor, a second transistor, a storage capacitor and a photoelectric detection device, and because an active layer of the second transistor is made of amorphous silicon semiconductor materials and an active layer of the first transistor is made of low-temperature poly-silicon semiconductor materials or metallic oxide semiconductor materials, transmission delay of an electric signal generated by the photoelectric detection device may be reduced by controlling conduction and cut-off of the first transistor and controlling conduction and cut-off of the second transistor.

10 Claims, 9 Drawing Sheets

FLAT PANEL DETECTOR AND DRIVING METHOD THEREOF

CROSS-REFERENCE TO RELATED APPLICATION

This application is based on and claims priority under 35 U.S.C 119 to Chinese Patent Application No. 202011248017.0, filed on Nov. 10, 2020, in the China National Intellectual Property Administration. The entire disclosure of the above application is incorporated herein by reference.

FIELD

The present disclosure relates to the technical field of detection, in particular to a flat panel detector and a driving method thereof.

BACKGROUND

An X-ray detection apparatus usually uses a flat panel detector to convert X-ray information into digital image information. A general flat panel detector includes a plurality of gate lines and a plurality of testing lines SL arranged in a crossed manner, and photosensitive pixels defined by the gate lines and the testing lines SL. Each photosensitive pixel may include a photodiode and a transistor coupled to the photodiode. In addition, the transistors are connected with the gate lines and the testing lines SL. In operation, a scintillator on the surface of the flat panel detector converts X-rays that are attenuated after passing through a human body into visible light, the photodiodes convert the visible light into an electrical signal, and drive the transistors to be turned on through gate scanning signals transmitted by the gate lines. The testing lines SL connected through the transistors read out the electrical signal converted by the photodiodes, thereby forming an X-ray digital image based on a signal line. Generally, active layers of the transistors in the flat panel detector are made of amorphous silicon semiconductor materials.

SUMMARY

An flat panel detector provided by an embodiment of the present disclosure includes: a base substrate, a plurality of scan lines and a plurality of testing lines located on the base substrate, and a plurality of detection units defined by the plurality of scan lines and the plurality of testing lines, wherein the plurality of scan lines include a plurality of first scan lines and a plurality of second scan lines;

each of the plurality of detection units includes: a first transistor, a second transistor, a storage capacitor and a photoelectric detection device, wherein an active layer of the second transistor is made of amorphous silicon semiconductor materials and an active layer of the first transistor is made of low-temperature poly-silicon semiconductor materials or metallic oxide semiconductor materials;

a gate of the first transistor is electrically connected with the first scan lines, a first pole of the first transistor is electrically connected with the testing lines, and a second pole of the first transistor is electrically connected with first electrode plate of the storage capacitor and a first pole of the second transistor;

a gate of the second transistor is electrically connected with the second scan lines, and a second pole of the second transistor is electrically connected with the photoelectric detection device; and a second electrode plate of the storage capacitor is electrically with a reference signal terminal.

In some examples, the flat panel detector includes:
a first semiconductor layer, located on the base substrate, wherein the first semiconductor layer includes the active layer of the first transistor;

a gate insulating layer, located on one side, away from the base substrate, of the first semiconductor layer;

a first conducting layer, located on one side, away from the base substrate, of the gate insulating layer, wherein the first conducting layer includes the gate of the first transistor and the first scan lines, and the first scan lines extend in a first direction;

an interlayer medium layer, located on one side, away from the base substrate, of the first conducting layer; and a second conducting layer, located on one side, away from the base substrate, of the interlayer medium layer, wherein the second conducting layer includes the first pole and the second pole of the first transistor and the testing lines, the first pole and the second pole of the first transistor are respectively electrically connected with the active layer of the first transistor through a first via hole penetrating the interlayer medium layer and the gate insulating layer, and the testing lines extend in a second direction; wherein the second transistor and the storage capacitor are respectively located on one side, away from the base substrate, of the first semiconductor layer.

In some examples, the flat panel detector further includes:
the gate of the second transistor and the second scan lines, and the second scan lines extend in the first direction;

the flat panel detector further includes: a second semiconductor layer located between the interlayer medium layer and the second conducting layer, wherein the second semiconductor layer includes the active layer of the second transistor; and the second conducting layer further includes the first pole and the second pole of the second transistor, wherein the first pole of the second transistor is in direct contact with a first end of the active layer of the second transistor, and the second pole of the second transistor is in direct contact with a second end of the active layer of the second transistor.

In some examples, the active layer of the first transistor and the active layer of the second transistor in each of the detection units are located on one side, close to the testing lines, of the each of the detection units, and a first scan line and a second scan line corresponding to each of the detection units are respectively located on two sides of the each of the detection units in the second direction.

In some embodiments, the interlayer medium layer includes a first interlayer medium layer located between the base substrate and the second conducting layer and a second interlayer medium layer located between the first interlayer medium layer and the second conducting layer;

the flat panel detector further includes: a third conducting layer located between the first interlayer medium layer and the second interlayer medium layer, and a second semiconductor layer located between the second interlayer medium layer and the second conducting layer, wherein the third conducting layer includes: the gate of the second transistor and the second scan lines, and the second scan lines extend in the first direction or the second direction;

the second semiconductor layer includes the active layer of the second transistor; and the second conducting layer further includes the first pole and the second pole of the second transistor, wherein the first pole of the second transistor is in direct contact with a first end of the active layer of the second transistor, and the second pole of the second transistor is in direct contact with a second end of the active layer of the second transistor.

In some embodiments, the active layer of the first transistor and the active layer of the second transistor in each of the detection units are located at two ends of a diagonal of the each of the detection units; and a second scan line and a testing line which are corresponding to each of the detection units are respectively located on two sides of the each of the detection units in the first direction.

In some embodiments, the second conducting layer further includes the gate of the second transistor and the second scan lines, wherein the second scan lines extend in the second direction;

the flat panel detector further includes: an interlayer insulating layer located on one side, away from the base substrate, of the second conducting layer, a second semiconductor layer located on one side, away from the base substrate, of the interlayer insulating layer, and a fourth conducting layer located on one side, away from the base substrate, of the second semiconductor layer;

the second semiconductor layer includes the active layer of the second transistor; and the fourth conducting layer includes the first pole and the second pole of the second transistor, wherein the first pole of the second transistor is in direct contact with a first end of the active layer of the second transistor, the second pole of the second transistor is in direct contact with a second end of the active layer of the second transistor, and the second pole of the second transistor is electrically connected with the first pole of the first transistor through a second via hole penetrating through the interlayer insulating layer.

In some embodiments, the second conducting layer further includes the first electrode plate of the storage capacitor, and the first electrode plate of the storage capacitor is connected between the second pole of the first transistor and the first pole of the second transistor.

In some embodiments, in response to the second conducting layer further including the first pole and the second pole of the second transistor, the first electrode plate of the storage capacitor, the second pole of the first transistor and the first pole of the second transistor are arrange in an integrated structure; and in response to the fourth conducting layer comprising the first pole of the second transistor, the first electrode plate of the storage capacitor and the second pole of the first transistor are arranged in an integrated structure and the first pole of the second transistor is electrically connected with the first electrode plate of the storage capacitor through the second via hole.

In some embodiments, the first conducting layer further includes a second electrode plate of the storage capacitor; or, the interlayer medium layer includes a first interlayer medium layer located between the base substrate and the second conducting layer, and a second interlayer medium layer located between the first interlayer medium layer and the second conducting layer; and the flat panel detector further includes: a third conducting layer located between the first interlayer medium layer and the second interlayer medium layer, wherein the third conducting layer includes: the second electrode plate of the storage capacitor.

According to a driving method of a flat panel detector provided by an embodiment of the present disclosure, the detection units are controlled to enter a detection cycle row by row, wherein an interval between detection cycles of two adjacent rows of detection units lasts at least one scan duration, and the scan duration refers to a maintenance duration of conduction of a first transistor;

the detection cycle of each row of detection units has an integration stage, a pre-transmission stage and an output stage;

in the integration stage, loading a cut-off control signal to a second scan line of the row to control second transistor in the row to be cut off; loading a cut-off control signal to a first scan line of the row to control first transistor in the row to be cut off; and after photoelectric detection device receive a light signal, converting the light signal into an electric signal;

in the pre-transmission stage, loading a conduction control signal to the second scan line of the row to control the second transistors in the row to be conducted; and loading a cut-off control signal to the first scan line of the row to control the first transistors in the row to be cut off; and in the output stage, loading a cut-off control signal to the second scan line of the row to control the second transistors in the row to be cut off; and loading a conduction control signal to the first scan line of the row to control the second transistors in the row to be conducted.

DETAILED DESCRIPTION OF THE EMBODIMENTS

Figure 1:
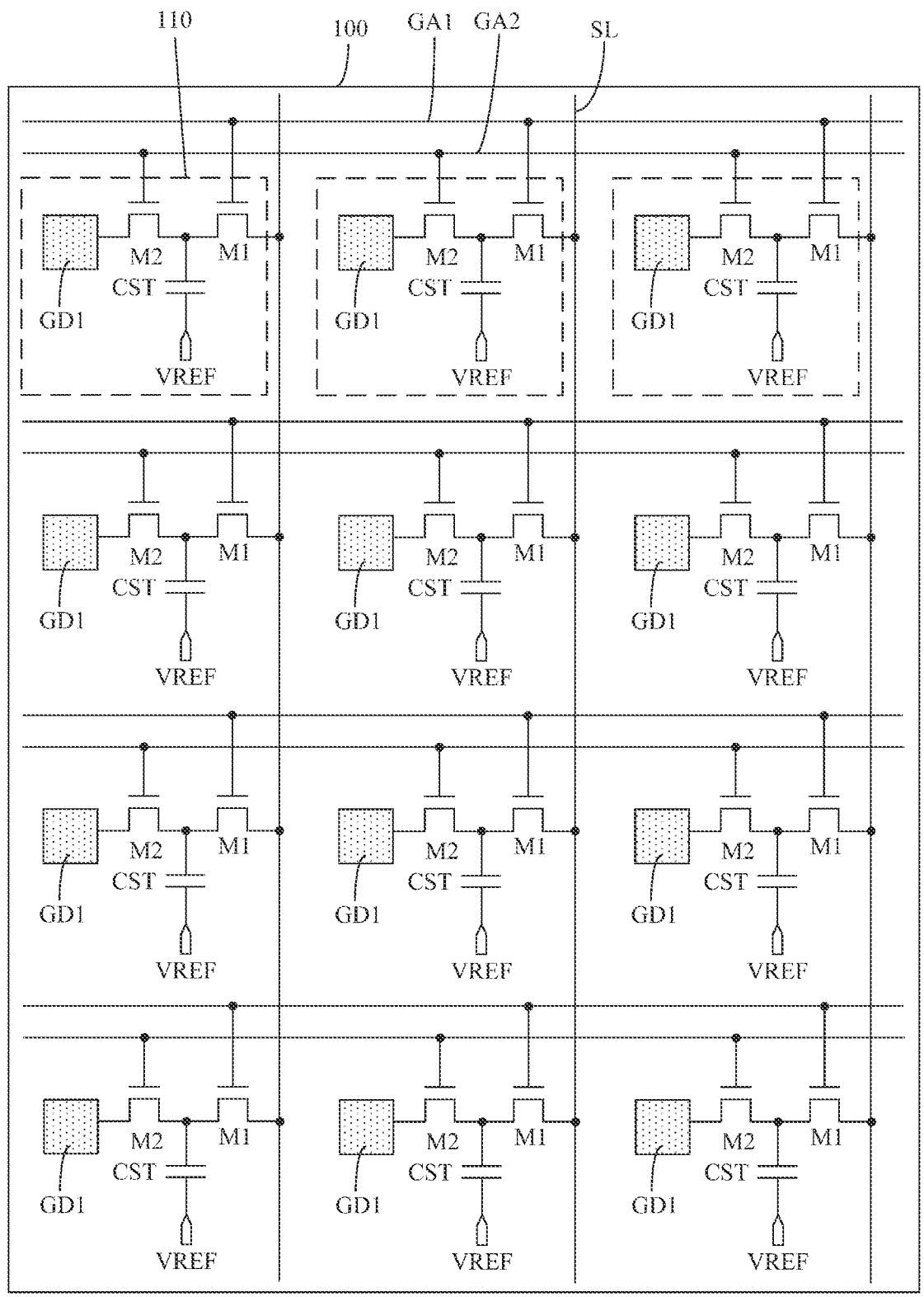
FIG. 1 is a schematic structural diagram of a flat panel detector in an embodiment of the present disclosure.

In order to make the objectives, technical solutions, and advantages of the present disclosure clearer, the technical solutions of embodiments of the present disclosure will be clearly and completely described in detail below in conjunction with the accompanying drawings of the embodiments of the present disclosure. Obviously, the described embodiments are only a part of the embodiments of the present disclosure, rather than all of the embodiments. In the case of no conflict, the embodiments of the present disclosure and the features in the embodiments can be combined with each other. Based on the described embodiments of the present disclosure, all other embodiments obtained by those of ordinary skill in the art without creative work shall fall within the protection scope of the present disclosure.

Unless otherwise defined, the technical terms or scientific terms used in the present disclosure shall have the common meanings understood by those of ordinary skill in the art to which the present disclosure belongs. The terms "first", "second" and similar words used in the present disclosure do not indicate any order, quantity or importance, but are only used to distinguish different components. "Include" or "comprise" and other similar words mean that an element or item appearing before the word covers an element or item listed after the word and their equivalents, but does not exclude other elements or items. Similar words such as "connecting" or "connected" are not limited to physical or mechanical connections, but may include electrical connections, whether direct or indirect.

It should be noted that sizes and shapes of each figure in the drawings do not reflect the true ratio, but are only to illustrate the content of the present disclosure. The same or similar reference numerals indicate the same or similar elements or elements with the same or similar functions.

As a refresh frequency of the flat-panel detector becomes higher and higher, turn-on time of the transistors becomes shorter and shorter, and the mobility of amorphous silicon is relatively, which leads to a larger delay in transmitting the electrical signal, so the accuracy of the formed X-ray digital image is reduced.

Figure 5:
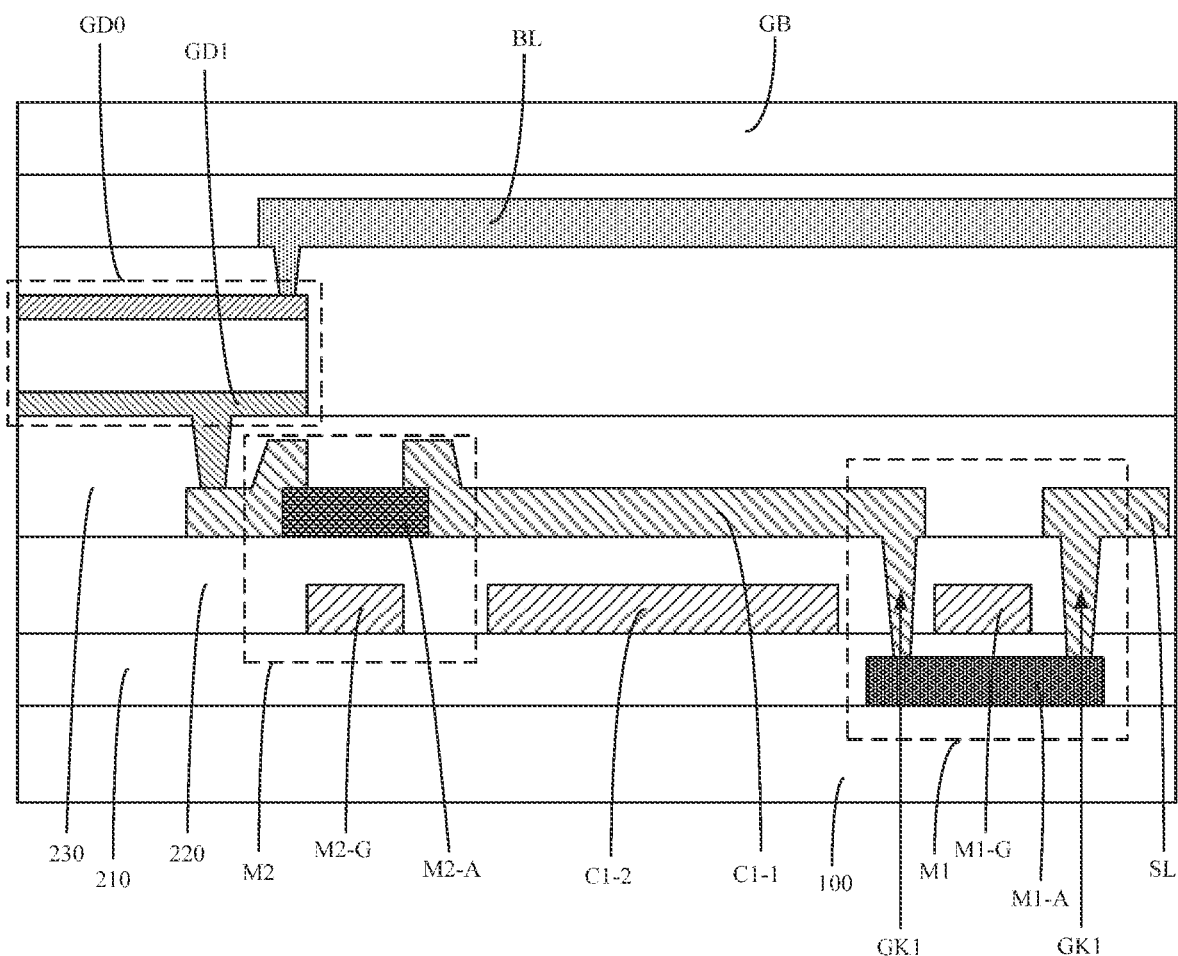
FIG. 5 is a schematic structural diagram of a section view in a direction AA' in the schematic structural diagram of the layout of the flat panel detector shown in FIG. 4.

An embodiment of the present disclosure provides a flat panel detector. As shown in FIG. 1 and FIG. 5, the flat panel detector may include: a base substrate 100, a plurality of scan lines and a plurality of testing lines SL located on the base substrate 100, and a plurality of detection units 110 defined by the plurality of scan lines and the plurality of testing lines SL; the plurality of scan lines include a plurality of first scan lines GA1 and a plurality of second scan lines GA2; each detection unit 110 includes: a first transistor M1, a second transistor M2, a storage capacitor CST and a photoelectric detection device GD0; active layers M2-A of the second transistors M2 are made of amorphous silicon semiconductor materials and active layers M1-A of the first transistors M1 are made of low-temperature poly-silicon semiconductor materials or metallic oxide semiconductor materials; gates M1-G of the first transistors M1 are electrically connected with the first scan lines GA1, first poles of the first scan lines GA1 are electrically connected with the testing lines SL, and second poles of the first scan lines GA1 are respectively electrically connected with the first electrode plates C1-1 of the storage capacitors CST and first poles of the second transistors M2; gates M2-G of the second transistors M2 are electrically connected with the second scan lines GA2 and second poles of the second transistors M2 are electrically connected with the photoelectric detection devices GD0; and second electrode plates of the storage capacitors CST are electrically with a reference signal terminal.

According to the flat panel detector provided by some embodiments of the present disclosure, the detection units includes: the first transistors, the second transistors, the storage capacitors and the photoelectric detection devices, and because the active layers of the second transistor are made of the amorphous silicon semiconductor materials and the active layers of the first transistors are made of the low-temperature poly-silicon semiconductor materials or the metallic oxide semiconductor materials, transmission delay of an electric signal generated by the photoelectric detection devices may be reduced by controlling conduction and cut-off of the first transistors and controlling conduction and cut-off of the second transistors. When the flat panel detector is applied to an X-ray detection apparatus, the accuracy of an X-ray digital image may be improved.

In some embodiments of the present disclosure, as shown in FIG. 1, the detection units 110 may be arranged in an array on the base substrate 100. In this way, the detection units 110 may be periodically arranged in a row direction and a column direction. Exemplarily, one row of the detection units 110 corresponds to one of the first scan lines GA1 and one of the second scan lines GA2, and one column of the detection units 110 corresponds to one of the testing lines SL. In a same row, the gates M1-G of the first transistors M1 in the row are all electrically connected with the corresponding first scan line GA1 and the gates M2-G of the second transistors M2 in the row are all electrically connected with the corresponding second scan line GA2. In a same column, the second poles of the second transistors M2 in the column are all electrically connected with the corresponding testing line SL.

In some embodiments of the present disclosure, the second poles of the second transistors M2 may be electrically connected with first electrodes GD1 of the photoelectric detection devices GD0 and second electrodes of the photoelectric detection devices GD0 may be electrically connected with a bias voltage signal line. Specifically, the bias voltage signal line inputs a bias voltage to the photoelectric detection devices GD0, an electric signal may be generated via a photoelectric conversion effect when the photoelectric detection devices GD0 receive a light signal, and the electric signal may be transmitted to the first electrode of the photoelectric detection devices GD0 and may be transmitted out through the second transistors M2. Exemplarily, a photoelectric detection device GD0 may be a photodiode (PIN).

Exemplarily, a voltage of the reference signal terminal may be a fixed voltage. For example, the reference signal terminal may be a grounded terminal.

Figure 2:
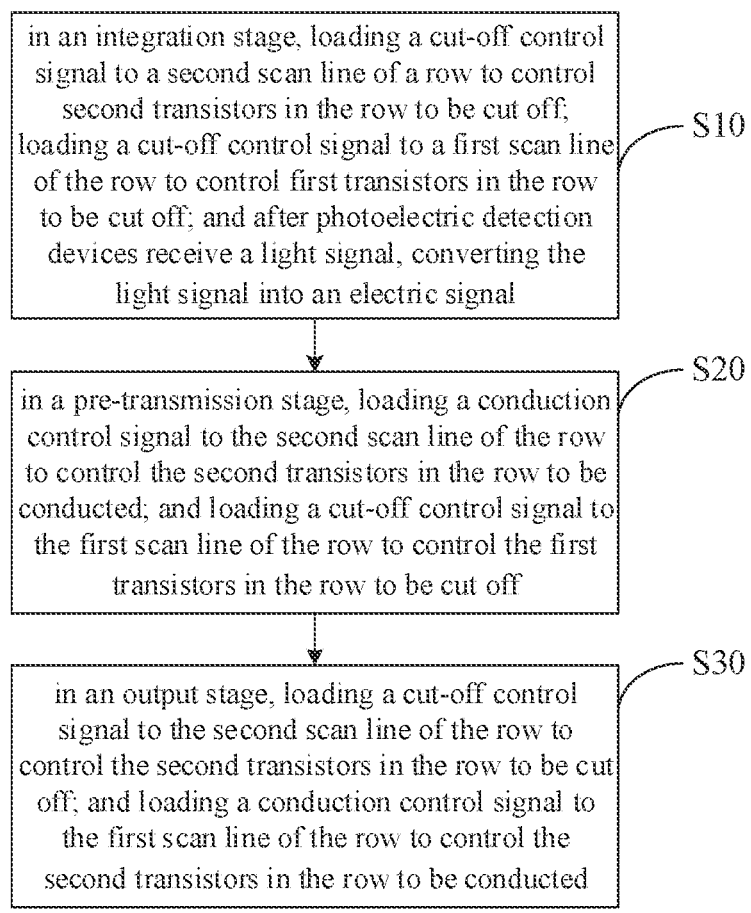
FIG. 2 is a flow chart of a driving method of a flat panel detector in an embodiment of the present disclosure.

An embodiment of the present disclosure further provides a driving method of a flat panel detector, including: controlling the detection units to enter a detection cycle row by row, wherein an interval between detection cycles of two adjacent rows of detection units lasts at least one scan duration, and the scan duration refers to a maintenance duration of conduction of a first transistor;

as shown in FIG. 2, the detection cycle of each row of detection units has an integration stage, a pre-transmission stage and an output stage;

S10, in the integration stage, a cut-off control signal is loaded to a second scan line of the row to control second transistors in the row to be cut off; a cut-off control signal is loaded to a first scan line of the row to control first transistors in the row to be cut off; and after photoelectric detection devices receive a light signal, the light signal is converted into an electric signal;

S20, in the pre-transmission stage, a conduction control signal is loaded to the second scan line of the row to control the second transistors in the row to be conducted; and a cut-off control signal is loaded to the first scan line of the row to control the first transistors in the row to be cut off; and S30, in the output stage, a cut-off control signal is loaded to the second scan line of the row to control the second transistors in the row to be cut off; and a conduction control signal is loaded to the first scan line of the row to control the second transistors in the row to be conducted.

Figure 3:
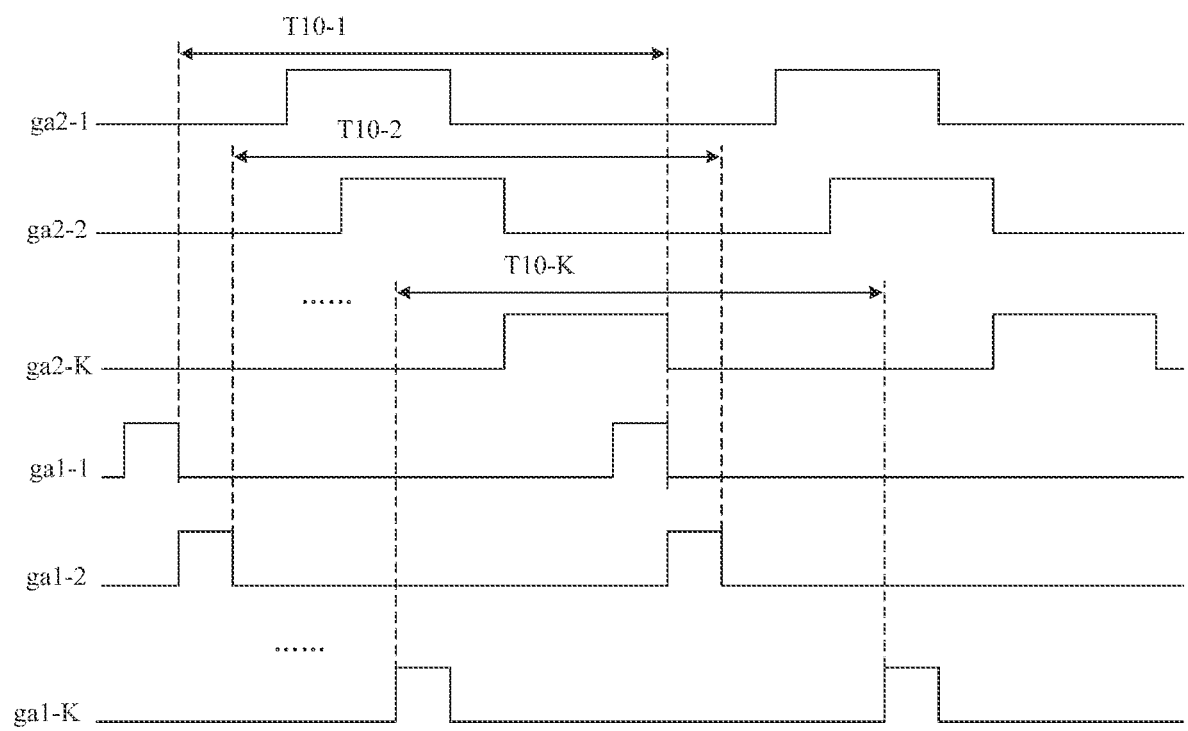
FIG. 3 is a signal sequence diagram in an embodiment of the present disclosure.

Descriptions of the driving method of the flat panel detector will be made below in combination with a signal sequence diagram as shown in FIG. 3 and a structure of the flat panel detector as shown in FIG. 1.

To take a flat panel detector provided with K rows of detection units 110 as an example, as shown in FIG. 3, ga1-1 is a signal transmitted by a first scan line GA1 corresponding to a first row of detection units 110, ga1-2 is a signal transmitted by a first scan line GA1 corresponding to a second row of detection units 110, and ga1-K is a signal transmitted by a first scan line GA1 corresponding to a K row of detection units 110. Ga2-1 is a signal transmitted by a second scan line GA2 corresponding to the first row of detection units 110, ga2-2 is a signal transmitted by a second scan line GA2 corresponding to the second row of detection units 110, and ga2-K is a signal transmitted by a second scan line GA2 corresponding to the K row of detection units 110. Specific numerical value of K may be designed and determined according to actual application, which is not limited here.

Further, as shown in FIG. 3, T10-1 represents a detection cycle the first row of detection units enter, T10-2 represents a detection cycle the second row of detection units enter, and T10-K represents a detection cycle the K row of detection units enter. An interval between detection cycles of two adjacent rows of detection units lasts at least one scan duration, and the scan duration refers to a maintenance duration of conduction of a first transistor.

The detection cycle T10-1 the first row of detection units enter may include an integration stage, a pre-transmission stage and an output stage. In the integration stage, the first scan line GA1 corresponding to the first row of detection units 110 transmits a cut-off control signal (for example, a low level signal) in the signal ga1-1, and the second scan line GA2 corresponding to the first row of detection units 110 transmits a cut-off control signal (for example, a low level signal) in the signal ga2-1, so first transistors M1 and second transistors M2 in the first row of detection units 110 are cut off. Photoelectric detection devices GD0 may receive a light signal and convert the light signal into an electric signal.

In the pre-transmission stage, the first scan line GA1 corresponding to the first row of detection units 110 transmits a cut-off control signal (for example, a low level signal) in the signal ga1-1, and the second scan line GA2 corresponding to the first row of detection units 110 transmits a conduction control signal (for example, a high level signal) in the signal ga2-1, so the first transistors M1 in the first row of detection units 110 are cut off and the second transistors M2 are conducted. After the photoelectric detection devices GD0 receive the light signal and convert the same into the electric signal, storage capacitors CST may be charged through the conducted second transistors M2 so that the electric signal is stored in the storage capacitors CST.

In the output stage, the first scan line GA1 corresponding to the first row of detection units 110 transmits a conduction control signal (for example, a high level signal) in the signal ga1-1, and the second scan line GA2 corresponding to the first row of detection units 110 transmits a cut-off control signal (for example, a low level signal) in the signal ga2-1, so the first transistors M1 in the first row of detection units 110 are conducted and the second transistors M2 are cut off. In this way, the electric signal stored in the storage capacitors CST may be input in testing lines SL through the conducted first transistors M1 and be input in a testing circuit through the testing lines SL, thereby forming an X-ray digital image.

The detection cycle T10-2 the second row of detection units enter may include an integration stage, a pre-transmission stage and an output stage. In the integration stage, the first scan line GA1 corresponding to the second row of detection units 110 transmits a cut-off control signal (for example, a low level signal) in the signal ga1-2, and the second scan line GA2 corresponding to the second row of detection units 110 transmits a cut-off control signal (for example, a low level signal) in the signal ga2-2, so first transistors M1 and second transistors M2 in the second row of detection units 110 are cut off. Photoelectric detection devices GD0 may receive a light signal and convert the light signal into an electric signal.

In the pre-transmission stage, the first scan line GA1 corresponding to the second row of detection units 110 transmits a cut-off control signal (for example, a low level signal) in the signal ga1-2, and the second scan line GA2 corresponding to the second row of detection units 110 transmits a conduction control signal (for example, a high level signal) in the signal ga2-2, so the first transistors M1 in the second row of detection units 110 are cut off and the second transistors M2 are conducted. After the photoelectric detection devices GD0 receive the light signal and convert the same into the electric signal, storage capacitors CST may be charged through the conducted second transistors M2 so that the electric signal is stored in the storage capacitors CST.

In the output stage, the first scan line GA1 corresponding to the second row of detection units 110 transmits a conduction control signal (for example, a high level signal) in the signal ga1-2, and the second scan line GA2 corresponding to the second row of detection units 110 transmits a cut-off control signal (for example, a low level signal) in the signal 2-2, so the first transistors M1 in the second row of detection units 110 are conducted and the second transistors M2 are cut off In this way, the electric signal stored in the storage capacitors CST may be input in testing lines SL through the conducted first transistors M1 and be input in a testing circuit through the testing lines SL, thereby forming an X-ray digital image.

The rest is the same and may be sequentially deduced by analogy, so repetition will not be made here.

Because the low-temperature poly-silicon semiconductor materials or the metallic oxide semiconductor materials have higher mobility than the amorphous silicon semiconductor materials, according to the flat panel detector provided by the embodiment of the present disclosure, by adopting the first transistors M1 as transistors for output and the second transistors M2 as transistors for transmission, delay of electric signal output may be reduced, rapid output of an electric signal may be achieved, a frame rate may be increased and imaging accuracy may be improved, thereby realizing a large-area flat panel detector. Further, by arranging the second transistors M2 to control light signal acquisition, a low leakage current may be effectively lowered.

Further, according to the flat panel detector provided by some embodiments of the present disclosure, an effect of reducing the delay of electric signal output may be realized simply by adding one first transistor M1. The flat panel detector is simple in design structure, good in compatibility with a manufacturing process, and easy for manufacturing in the process.

Exemplarily, the first transistor M1 may be a top gate type transistor and a second transistor M2 may be a bottom gate type transistor.

Figure 4:
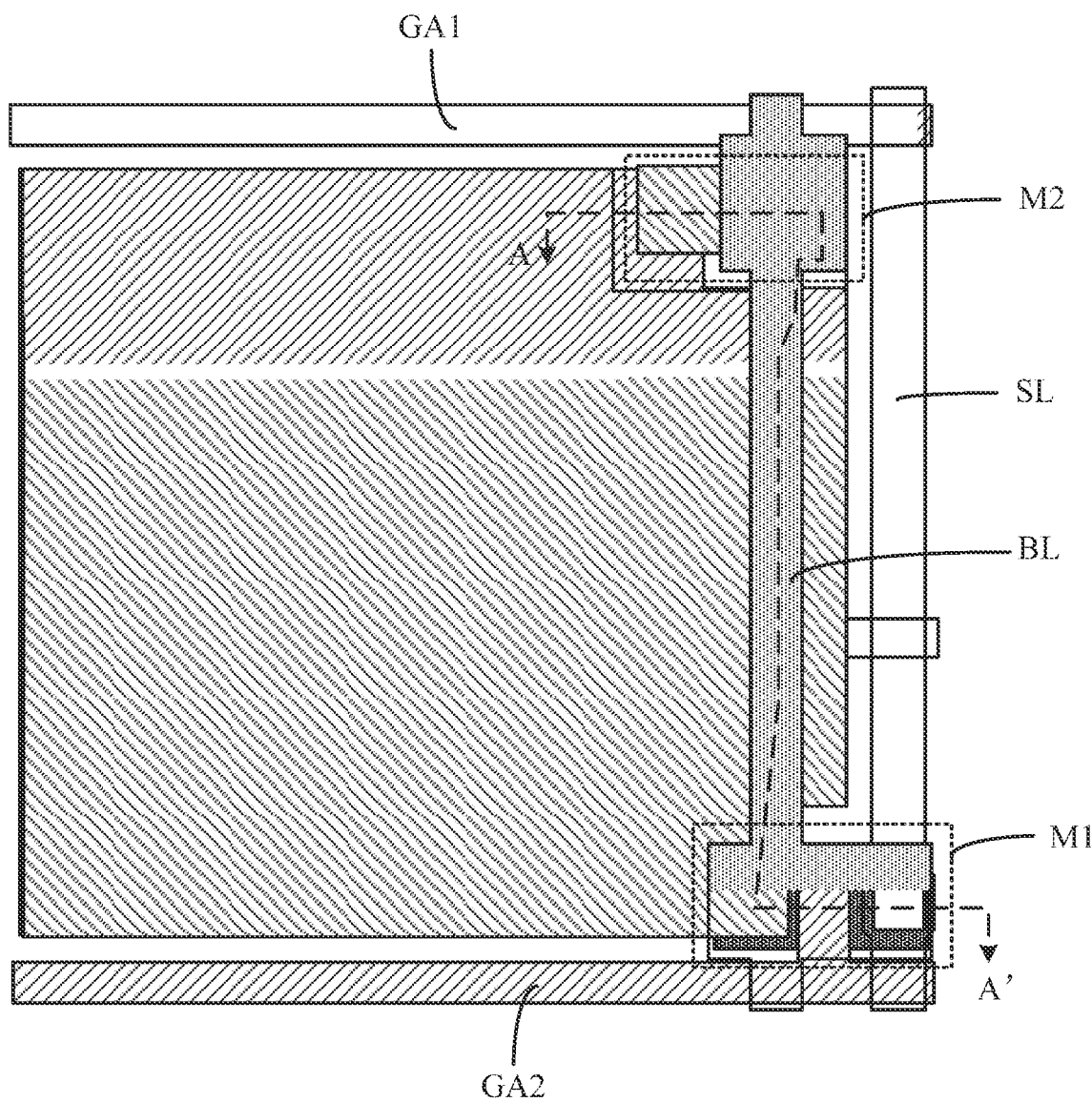
FIG. 4 is a schematic structural diagram of a layout of a flat panel detector in an embodiment of the present disclosure.

Exemplarily, as shown in FIGS. 4 and 5, the flat panel detector may include the base substrate 100, a first semiconductor layer located on the base substrate 100, a gate insulating layer 210 located on one side, away from the base substrate 100, of the first semiconductor layer, a first conducting layer located on one side of the gate insulating layer 210 away from the base substrate 100, an interlayer medium layer 220 located on one side, away from the base substrate 100, of the first conducting layer, a second conducting layer located on one side of the interlayer medium layer 220 away from the base substrate 100, and a second semiconductor layer located between the interlayer medium layer 220 and the second conducting layer. Specifically, a second transistor M2 and a storage capacitor CST may be respectively located on one side, away from the base substrate 100, of the first semiconductor layer.

Exemplarily, the first semiconductor layer may be made of low-temperature poly-silicon semiconductor materials, or the first semiconductor layer may be made of metallic oxide semiconductor materials, for example, IGZO (Indium Gallium Zinc Oxide). Exemplarily, as shown in FIGS. 4 and 5, the first semiconductor layer may include an active layer M1-A of a first transistor M1. In this way, mobility of the transistor M1 may be improved.

Exemplarily, as shown in FIGS. 4 and 5, the first semiconductor layer may include a gate M1-G of the first transistor M1 and first scan lines GA1; and the first scan lines GA1 extend in a first direction F1 and are arranged in a second direction F2. The first semiconductor layer may further include: a gate M2-G of a second transistor M2, a second electrode plate C1-2 of a storage capacitor CST, and second scan lines GA2; and the second scan lines extend in the first direction F1 and are arranged in the second direction F2. In this way, the gate M1-G of the first transistor M1, the first scan lines GA1, the gate M2-G of the second transistor M2, the second electrode plate C1-2 of the storage capacitor CST and the second scan lines GA2 are arranged on a same layer, i.e. forming is conducted through a one-time composition process.

Exemplarily, the first direction F1 may be a row direction or a column direction, which is not limited here. Descriptions will be made below taking the first direction F1 being a row direction as an example.

Exemplarily, as shown in FIGS. 4 and 5, the second semiconductor layer includes an active layer M2-A of the second transistor M2. Exemplarily, the second semiconductor layer may be made of amorphous silicon semiconductor materials. For example, the second semiconductor layer may be made of amorphous silicon semiconductor materials doped with H. In this way, a leakage current of the second transistor M2 may be lowered.

Exemplarily, as shown in FIGS. 4 and 5, the second conducting layer may include the first pole and the second pole of the first transistor M1, the testing lines SL, the first pole and the second pole of the second transistor M2, and a first electrode plate C1-1 of the storage capacitor; and the first pole and the second pole of the first transistor M1 are electrically connected with an active layer M1-A of the first transistor M1 through a first via hole GK1 penetrating the interlayer medium layer 220 and the gate insulting layer 210. Further, the first pole of the second transistor M2 is in direct contact with a first end of an active layer M2-A of the second transistor M2, and the second pole of the second transistor M2 is in direct contact with a second end of the active layer M2-A of the second transistor M2. The testing lines extend in the second direction F2 and are arranged in the first direction F1. Moreover, the first electrode plate C1-1 of the storage capacitor CST is electrically connected between the second pole of the first transistor M1 and the first pole of the second transistor M2. In this way, the first pole and the second pole of the first transistor M1, the testing lines SL, the first pole and the second pole of the second transistor M2, and the first electrode plate C1-1 of the storage capacitor CST are formed by a same composition process.

Exemplarily, the second direction F2 may be a row direction or a column direction, which is not limited here. Descriptions will be made below taking the second direction F2 being a column direction as an example.

Exemplarily, as shown in FIGS. 4 and 5, when the second conducting layer further includes the first pole and the second pole of the second transistor M2, the first electrode plate C1-1 of the storage capacitor CST, the second pole of the first transistor M1 and the first pole of the second transistor M2 may be arranged in an integrated structure.

Exemplarily, as shown in FIGS. 4 and 5, the flat panel detector further includes: a planarization layer 230 located on one side of the second semiconductor facing away from the base substrate 100, a photoelectric detection device GD0 located on one side of the planarization layer 230 facing away from the base substrate 100, a photoelectric insulation layer located on one side, facing away from the base substrate 100, of the photoelectric detection device GD0, a bias voltage signal line BL located on one side, facing away from the base substrate 100, of the photoelectric insulation layer, a bonding layer located on one side, facing away from the base substrate 100, of the bias voltage signal line BL, and a protective cover plate GB located on the bonding layer facing away from the base substrate 100. Exemplarily, the second pole of the second transistor M2 is electrically connected with a first electrode GD1 of the photoelectric detection device GD0 through a via hole facing away from 230.

Exemplarily, as shown in FIGS. 4 and 5, the photoelectric detection device GD0 may include a first electrode, a photovoltaic conversion layer and a second electrode which are arranged on the base substrate 100 in a laminated mode. For example, the photovoltaic conversion layer may be patterned so that one independent photovoltaic conversion layer is arranged in one detection unit 110. Further, the first electrode is patterned so that an independent first electrode is arranged in the detection unit 110. Besides, the second electrode may cover the base substrate 100 in a whole-layer mode.

Exemplarily, as shown in FIGS. 4 and 5, the active layer M1-A of the first transistor M1 and the active layer M2-A of the second transistor M2 in the same detection unit 110 are located on one side, close to the testing lines SL, of the detection unit 110.

Exemplarily, as shown in FIGS. 4 and 5, the first scan line GA1 and the second scan line GA2 corresponding to the same detection unit 110 are respectively located on two sides of the detection unit 110 in the second direction F2.

Figure 6:
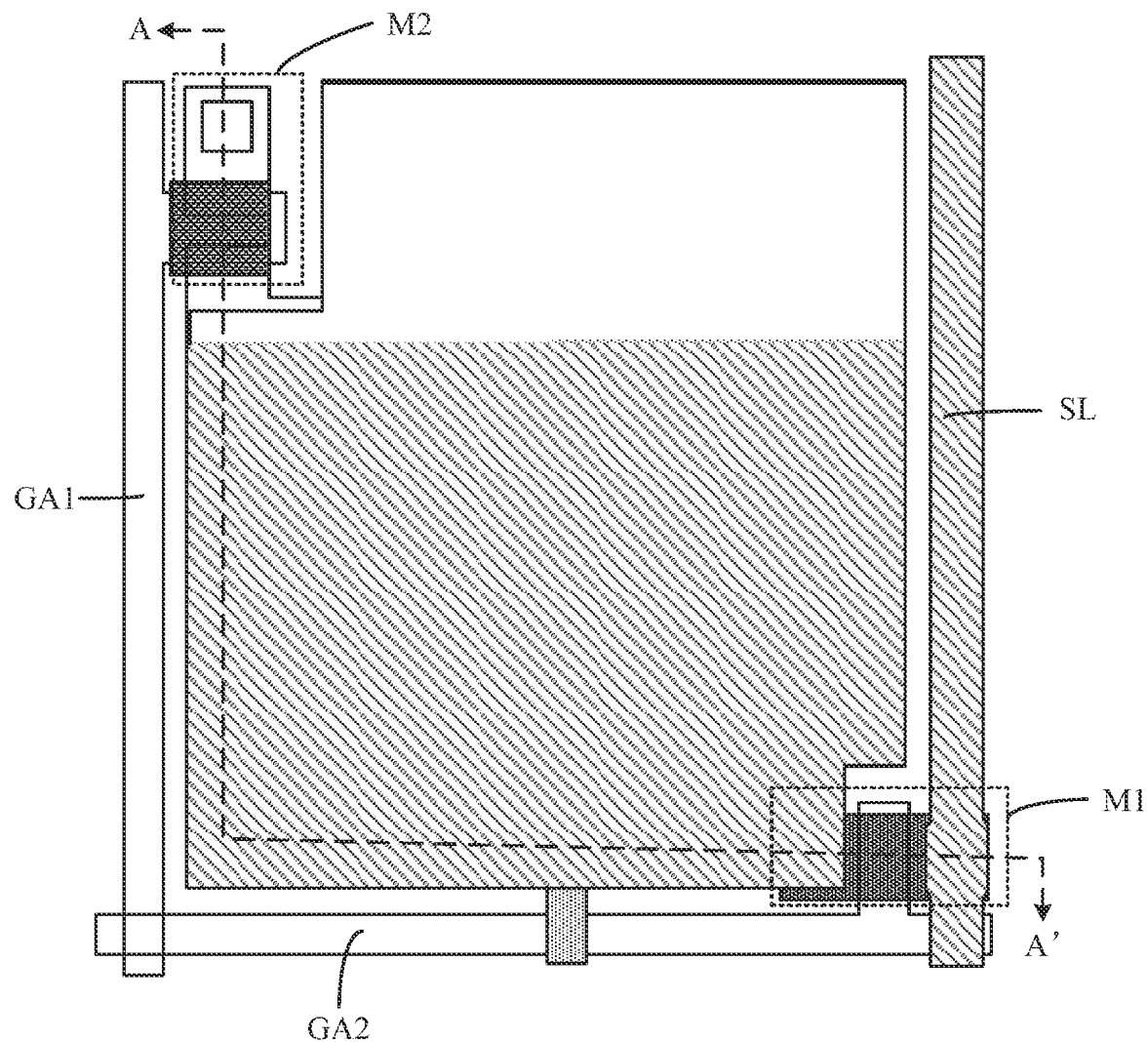
FIG. 6 is a schematic structural diagram of a layout of a flat panel detector in an embodiment of the present disclosure.
Figure 7:
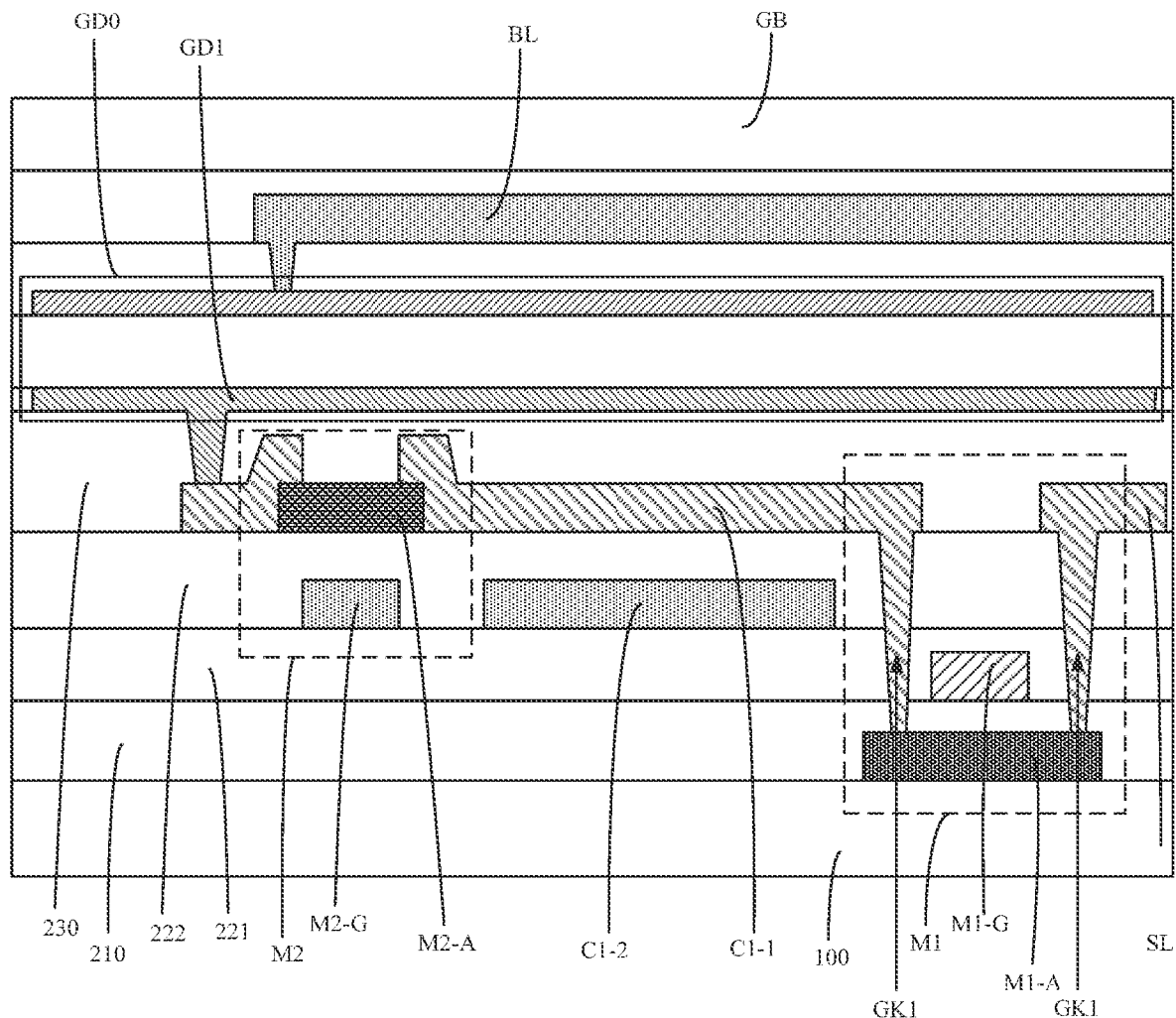
FIG. 7 is a schematic structural diagram of a section view in a direction AA' in the schematic structural diagram of the layout of the flat panel detector shown in FIG. 6.

An embodiment of the present disclosure further provides another flat panel detector. As shown in FIGS. 6 and 7, transformation is made on the basis of implementations in the aforesaid embodiments. Only differences between the embodiment and the aforesaid embodiments are described below, and similarities will not be repeated here.

Exemplarily, as shown in FIGS. 6 and 7, the flat panel detector may include the base substrate 100, the first semiconductor layer located on the base substrate 100, the gate insulating layer 210 located on one side, away from the base substrate 100, of the first semiconductor layer, the first conducting layer located on one side, away from the base substrate 100, of the gate insulating layer 210, the interlayer medium layer 220 located on one side, away from the base substrate 100, of the first conducting layer, and the second conducting layer located on one side, away from the base substrate 100, of the interlayer medium layer 220. Moreover, the interlayer medium layer 220 may include a first interlayer medium layer 221 located between the base substrate 100 and the second conducting layer and a second interlayer medium layer 222 located between the first interlayer medium layer 220 and the second conducting layer, i.e. the second conducting layer is located on one side of the second interlayer medium layer 220 away from the base substrate 100. Further, the flat panel detector may include: a third conducting layer located between the first interlayer medium layer 221 and the second interlayer medium layer 222, and a second semiconductor layer located between the second interlayer medium layer 222 and the second conducting layer.

Exemplarily, as shown in FIGS. 6 and 7, the first semiconductor layer may include the active layer M1-A of the first transistor M1. In this way, mobility of the first transistor M1 may be improved.

Exemplarily, as shown in FIGS. 6 and 7, the first conducting layer may include a gate M1-G of the first transistor M1 and first scan lines GA1; and the first scan lines GA1 extend in the second direction F2 and are arranged in the first direction F1. In this way, the gate M1-G of the first transistor M1 and the first scan lines GA1 are arranged on a same layer, i.e. formed through a one-time composition process.

Exemplarily, as shown in FIGS. 6 and 7, the third conducting layer includes: a gate M2-G of the second transistor M2 and the second scan lines GA2; and the second scan lines GA2 may extend in the second direction F2 and be arranged in the first direction F1. Of course, the second scan lines GA2 may also extend in the first direction F1 and be arranged in the second direction F2, which is not limited here. In this way, the gate M2-G of the second transistor M2 and the second scan lines GA2 are arranged on a same layer, i.e. forming is conducted through a one-time composition process.

Exemplarily, as shown in FIGS. 6 and 7, the third conducting layer may further include: a second electrode plate C1-2 of the storage capacitor CST. In this way, the second electrode plate C1-2 of the storage capacitor CST and the second scan lines GA2 are arranged on a same layer, i.e. formed through a one-time composition process.

Exemplarily, as shown in FIGS. 6 and 7, the second semiconductor layer includes an active layer M2-A of the second transistor M2. Exemplarily, the second semiconductor layer may be made of amorphous silicon semiconductor materials. In this way, a leakage current of the second transistor M2 may be lowered.

Exemplarily, as shown in FIGS. 6 and 7, the second conducting layer may include a first pole and a second pole of a first transistor M1, testing lines SL, a first pole and a second pole of a second transistor M2, and a first electrode plate C1-1 of a storage capacitor; and the first pole and the second pole of the first transistor M1 are electrically connected with an active layer M1-A of the first transistor M1 through a first via hole GK1 penetrating the interlayer medium layer 220 and the gate insulting layer 210. Further, the first pole of the second transistor M2 is in direct contact with a first end of an active layer M2-A of the second transistor M2, and the second pole of the second transistor M2 is in direct contact with a second end of the active layer M2-A of the second transistor M2. The testing lines extend in the second direction F2 and are arranged in the first direction F1. Moreover, the first electrode plate C1-1 of the storage capacitor CST is electrically connected between the second pole of the first transistor M1 and the first pole of the second transistor M2. In this way, the first pole and the second pole of the first transistor M1, the testing lines SL, the first pole and the second pole of the second transistor M2, and the first electrode plate C1-1 of the storage capacitor CST are formed by a same composition process.

Exemplarily, as shown in FIGS. 6 and 7, the photoelectric detection device GD0 may include a first electrode, a photovoltaic conversion layer and a second electrode which are arranged on the base substrate 100 in a laminated mode. For example, the photovoltaic conversion layer may cover the base substrate 100 in a whole-layer mode, and the first electrode is patterned so that an independent first electrode is arranged in one detection unit 110. Besides, the second electrode may cover the base substrate 100 in a whole-layer mode.

Exemplarily, as shown in FIGS. 6 and 7, the active layer M1-A of the first transistor M1 and the active layer M2-A of the second transistor M2 in the same detection unit 110 are located at two ends of a diagonal of the detection unit 110. Exemplarily, the same detection unit 110 may be rectangle, and the active layer M1-A of the first transistor M1 and the active layer M2-A of the second transistor M2 are located at two ends of a diagonal of the rectangle detection unit 110.

Exemplarily, the second scan lines GA2 may extend in the second direction F2 and be arranged in the first direction F1. The second scan line GA2 and the testing line SL corresponding to the same detection unit 110 are respectively located on two sides of the detection unit 110 in the first direction F1.

Alternatively, the second scan lines GA2 may extend in the first direction F1 and be arranged in the second direction F2. The second scan line GA2 and the testing line SL corresponding to the same detection unit 110 are respectively located on two sides of the detection unit 110 in the second direction F2.

Figure 8:
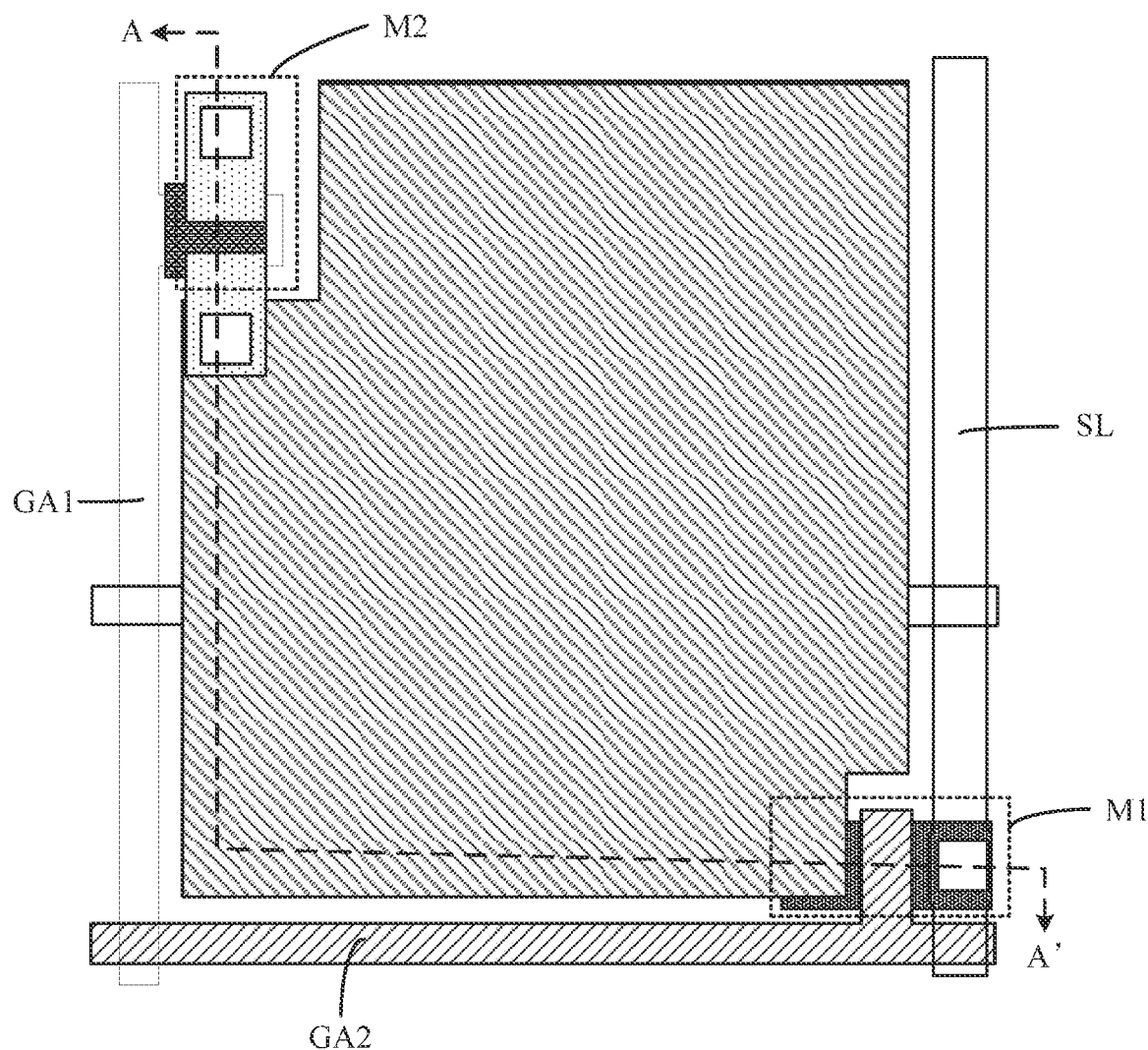
FIG. 8 is a schematic structural diagram of a layout of a flat panel detector in an embodiment of the present disclosure.
Figure 9:
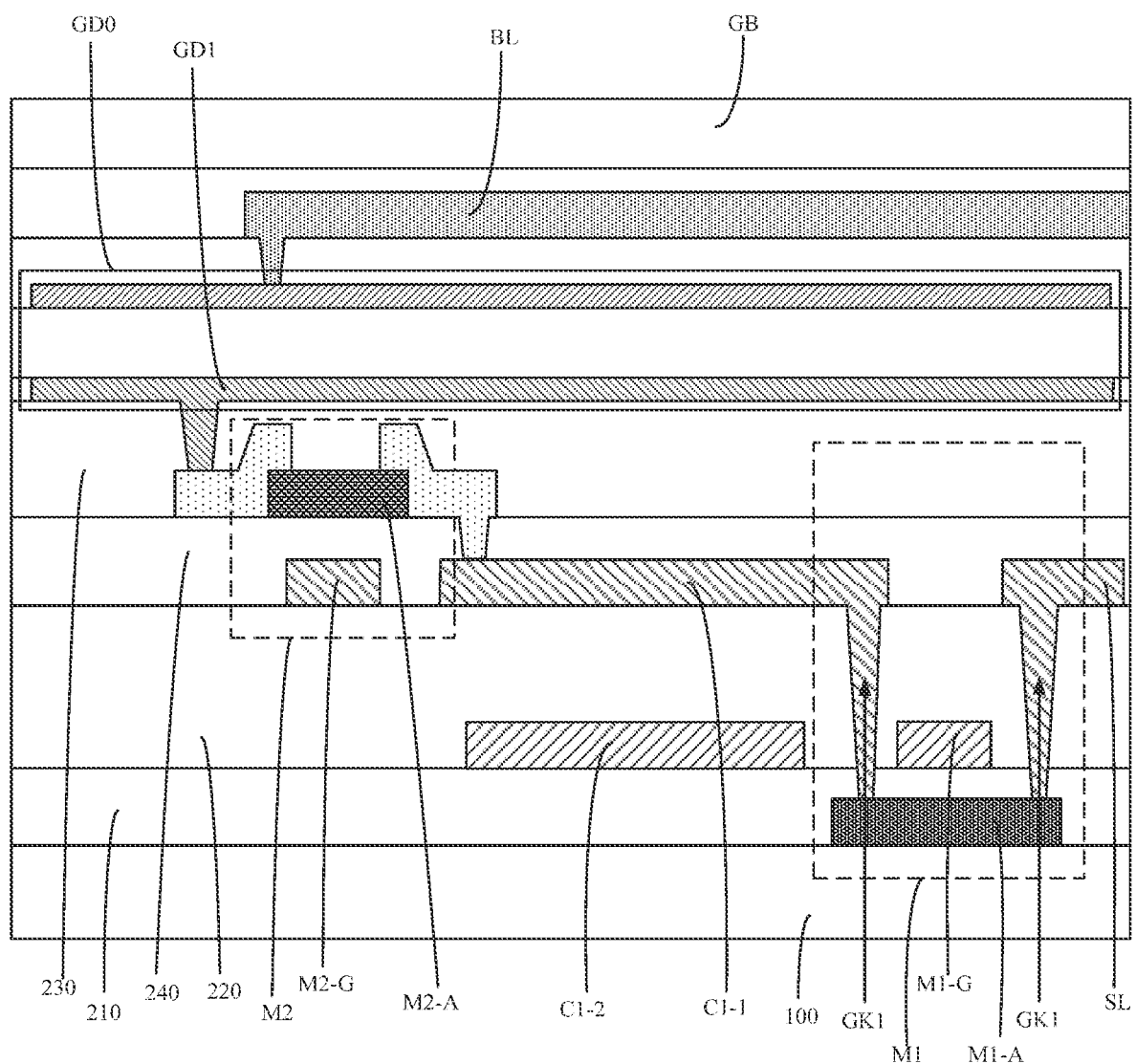
FIG. 9 is a schematic structural diagram of a section view in a direction AA' in the schematic structural diagram of the layout of the flat panel detector shown in FIG. 8.

An embodiment of the present disclosure further provides another flat panel detector. As shown in FIGS. 8 and 9, transformation is made on the basis of implementations in the aforesaid embodiments. Only differences between the embodiment and the aforesaid embodiments are described below, and similarities will not be repeated here.

Exemplarily, as shown in FIGS. 8 and 9, the flat panel detector may include the base substrate 100, the first semiconductor layer located on the base substrate 100, the gate insulating layer 210 located on one side, away from the base substrate 100, of the first semiconductor layer, the first conducting layer located on one side, away from the base substrate 100, of the gate insulating layer 210, the interlayer medium layer 220 located on one side, away from the base substrate 100, of the first conducting layer, the second conducting layer located on one side, away from the base substrate 100, of the interlayer medium layer 220, the interlayer insulating layer 240 located on one side, away from the base substrate 100, of the second conducting layer, the second semiconductor layer located on one side, away from the base substrate 100, of the interlayer insulating layer 240, and the fourth conducting layer located on one side, away from the base substrate 100, of the second semiconductor layer.

Exemplarily, as shown in FIGS. 8 and 9, the first semiconductor layer may include the active layer M1-A of the first transistor M1. In this way, mobility of the first transistor M1 may be improved.

Exemplarily, as shown in FIGS. 8 and 9, the first conducting layer may include the gate M1-G of the first transistor M1 and the first scan lines GA1; and the first scan lines GA1 extend in the second direction F2 and are arranged in the first direction F1. In this way, the gate M1-G of the first transistor M1 and the first scan lines GA1 are arranged on a same layer, i.e. forming is conducted through a one-time composition process.

Exemplarily, as shown in FIGS. 8 and 9, the first conducting layer may further include: the second electrode plate C1-2 of the storage capacitor CST. In this way, the gate M1-G of the first transistor M1, the first scan lines GA1 and the second electrode plate C1-2 of the storage capacitor CST are arranged on a same layer, i.e. formed through a one-time composition process.

Exemplarily, as shown in FIGS. 8 and 9, the second conducting layer may include the first pole and the second pole of the first transistor M1, the testing lines SL, the gate M2-G of the second transistor M2, and the second scan lines GA2, wherein the testing lines SL may extend in the second direction F2 and be arranged in the first direction F1 and the second scan lines GA2 extend in the first direction F1 and are arranged in the second direction F2.

Exemplarily, as shown in FIGS. 8 and 9, the second conducting layer may further include the first electrode plate C1-1 of the storage capacitor CST. Specifically, the first electrode plate C1-1 of the storage capacitor CST and the second pole of the first transistor M1 are arranged in an integrated structure, and the first pole of the second transistor M2 is electrically connected with the first electrode plate C1-1 of the storage capacitor CST through the second via hole.

Exemplarily, as shown in FIGS. 8 and 9, the second semiconductor layer includes the active layer M2-A of the second transistor M2-A. Exemplarily, the second semiconductor layer may be made of amorphous silicon semiconductor materials. For example, the second semiconductor layer may be made of amorphous silicon semiconductor materials doped with H. In this way, a leakage current of the second transistor M2 may be lowered.

Exemplarily, as shown in FIGS. 8 and 9, the fourth conducting layer may include the first pole and the second pole of the second transistor M2, wherein the first pole of the second transistor M2 is in direct contact with a first end of the active layer M2-A of the second transistor M2, the second pole of the second transistor M2 is in direct contact with a second end of the active layer M2-A of the second transistor M2 and the second pole of the second transistor M2 is electrically connected with a first pole of a first transistor M1 through a second via hole penetrating through the interlayer insulating layer 240. Exemplarily, the second pole of the second transistor M2 is electrically connected with a first electrode plate C1-1 of a storage capacitor CST through the via hole penetrating through the interlayer insulating layer 240.

Exemplarily, as shown in FIGS. 8 and 9, the active layer M1-A of the first transistor M1 and the active layer M2-A of the second transistor M2 in the same detection unit 110 are located at two ends of a diagonal of the detection unit 110. Exemplarily, the same detection unit 110 may be rectangle, and the active layer M1-A of the first transistor M1 and the active layer M2-A of the second transistor M2 are located at two ends of a diagonal of the rectangle detection unit 110.

Exemplarily, the second scan lines GA2 may extend in the second direction F2 and be arranged in the first direction F1. The second scan line GA2 and the testing line SL corresponding to the same detection unit 110 are respectively located on two sides of the detection unit 110 in the second direction F2.

Alternatively, the second scan lines GA2 may extend in the first direction F1 and be arranged in the second direction F2. The second scan line GA2 and the testing line SL corresponding to the same detection unit 110 are respectively located on two sides of the detection unit 110 in the first direction F1.

It should be noted that, technical features of the embodiments may be combined with each other, and schemes after their combination are not repeated here.

Apparently, those of skill in the art may make various changes and modifications to the present disclosure without departing from the spirit and scope of the present disclosure. In this way, if these modifications and variations of the present disclosure fall within the scope of the claims of the present disclosure and their equivalent technologies, the present disclosure is also intended to include these modifications and variations.

What is claimed is:

1. A flat panel detector, comprising: a base substrate, a plurality of scan lines and a plurality of signal lines located on the base substrate, and a plurality of detection units defined by the plurality of scan lines and the plurality of signal lines, wherein the plurality of scan lines comprise a plurality of first scan lines and a plurality of second scan lines;
   each of the plurality of detection units comprises: a first transistor, a second transistor, a storage capacitor and a photoelectric detection device, wherein an active layer of the second transistor is made of amorphous silicon semiconductor materials and an active layer of the first transistor is made of low-temperature poly-silicon semiconductor materials or metallic oxide semiconductor materials;
   a gate of the first transistor is electrically connected with the first scan lines, a first pole of the first transistor is electrically connected with the signal lines, and a second pole of the first transistor is electrically connected with first electrode plate of the storage capacitor and a first pole of the second transistor;
   a gate of the second transistor is electrically connected with the second scan lines, and a second pole of the second transistor is electrically connected with the photoelectric detection device; and
   a second electrode plate of the storage capacitor is electrically connected with a reference signal terminal;
   wherein the flat panel detector further comprises:
   a first semiconductor layer, located on the base substrate, wherein the first semiconductor layer comprises the active layer of the first transistor;
   a gate insulating layer, located on one side, away from the base substrate, of the first semiconductor layer;
   a first conducting layer, located on one side, away from the base substrate, of the gate insulating layer, wherein the first conducting layer comprises the gate of the first transistor and the first scan lines, and the first scan lines extend in a first direction;
   an interlayer medium layer, located on one side, away from the base substrate, of the first conducting layer; and
   a second conducting layer, located on one side, away from the base substrate, of the interlayer medium layer, wherein the second conducting layer comprises the first pole and the second pole of the first transistor and the signal lines, the first pole and the second pole of the first transistor are respectively electrically connected with the active layer of the first transistor through a first via hole penetrating the interlayer medium layer and the gate insulating layer, and the signal lines extend in a second direction; wherein the second transistor and the storage capacitor are respectively located on one side, away from the base substrate, of the first semiconductor layer.

2. The flat panel detector according to claim 1, wherein the first conducting layer further comprises:
   the gate of the second transistor and the second scan lines, and the second scan lines extend in the first direction;
   the flat panel detector further comprises: a second semiconductor layer located between the interlayer medium layer and the second conducting layer, wherein the second semiconductor layer comprises the active layer of the second transistor; and
   the second conducting layer further comprises the first pole and the second pole of the second transistor, wherein the first pole of the second transistor is in direct contact with a first end of the active layer of the second transistor, and the second pole of the second transistor is in direct contact with a second end of the active layer of the second transistor.

3. The flat panel detector according to claim 2, wherein the active layer of the first transistor and the active layer of the second transistor in each of the detection units are located on one side, close to the signal lines, of the each of the detection units; and
   a first scan line and a second scan line corresponding to each of the detection units are respectively located on two sides of the each of the detection units in the second direction.

4. The flat panel detector according to claim 1, wherein the interlayer medium layer comprises a first interlayer medium layer located between the base substrate and the second conducting layer and a second interlayer medium layer located between the first interlayer medium layer and the second conducting layer;
   the flat panel detector further comprises: a third conducting layer located between the first interlayer medium layer and the second interlayer medium layer, and a second semiconductor layer located between the second interlayer medium layer and the second conducting layer, wherein the third conducting layer comprises: the gate of the second transistor and the second scan lines, and the second scan lines extend in the first direction or the second direction;
   the second semiconductor layer comprises the active layer of the second transistor; and
   the second conducting layer further comprises the first pole and the second pole of the second transistor, wherein the first pole of the second transistor is in direct contact with a first end of the active layer of the second transistor, and the second pole of the second transistor is in direct contact with a second end of the active layer of the second transistor.

5. The flat panel detector according to claim 4, wherein the active layer of the first transistor and the active layer of the second transistor in each of the detection units are located at two ends of a diagonal of the each of the detection units; and
   a second scan line and a signal line which are corresponding to each of the detection units are respectively located on two sides of the each of the detection units in the first direction.

6. The flat panel detector according to claim 1, wherein the second conducting layer further comprises the gate of the second transistor and the second scan lines, wherein the second scan lines extend in the second direction;
   the flat panel detector further comprises: an interlayer insulating layer located on one side, away from the base substrate, of the second conducting layer, a second semiconductor layer located on one side, away from the base substrate, of the interlayer insulating layer, and a fourth conducting layer located on one side, away from the base substrate, of the second semiconductor layer;
   the second semiconductor layer comprises the active layer of the second transistor; and
   the fourth conducting layer comprises the first pole and the second pole of the second transistor, wherein the first pole of the second transistor is in direct contact with a first end of the active layer of the second transistor, the second pole of the second transistor is in direct contact with a second end of the active layer of the second transistor, and the second pole of the second transistor is electrically connected with the first pole of the first transistor through a second via hole penetrating through the interlayer insulating layer.

7. The flat panel detector according to claim 1, wherein the second conducting layer further comprises the first electrode plate of the storage capacitor, and the first electrode plate of the storage capacitor is connected between the second pole of the first transistor and the first pole of the second transistor.

8. The flat panel detector according to claim 7, wherein in response to the second conducting layer further comprising the first pole and the second pole of the second transistor, the first electrode plate of the storage capacitor, the second pole of the first transistor and the first pole of the second transistor are arrange in an integrated structure; and
   in response to the fourth conducting layer comprising the first pole of the second transistor, the first electrode plate of the storage capacitor and the second pole of the first transistor are arranged in an integrated structure and the first pole of the second transistor is electrically connected with the first electrode plate of the storage capacitor through the second via hole.

9. The flat panel detector according to claim 1, wherein the first conducting layer further comprises a second electrode plate of the storage capacitor; or, the interlayer medium layer comprises a first interlayer medium layer located between the base substrate and the second conducting layer, and a second interlayer medium layer located between the first interlayer medium layer and the second conducting layer; and the flat panel detector further comprises: a third conducting layer located between the first interlayer medium layer and the second interlayer medium layer, wherein the third conducting layer comprises: the second electrode plate of the storage capacitor.

10. A method for driving the flat panel detector according to claim 1, comprising:
   controlling the detection units to enter a detection cycle row by row, wherein an interval between detection cycles of two adjacent rows of detection units lasts at least one scan duration, and the scan duration refers to a maintenance duration of conduction of the first transistor;
   the detection cycle of each row of detection units has an integration stage, a pre-transmission stage and an output stage;
   in the integration stage, loading a cut-off control signal to a second scan line of the row to control a second transistor in the row to be cut off;
   loading a cut-off control signal to a first scan line of the row to control a first transistor in the row to be cut off; and after the photoelectric detection devices receive a light signal, converting the light signal into an electric signal;

in the pre-transmission stage, loading a conduction control signal to the second scan line of the row to control the second transistor in the row to be conducted; and loading a cut-off control signal to the first scan line of the row to control the first transistor in the row to be cut off; and in the output stage, loading a cut-off control signal to the second scan line of the row to control the second transistor in the row to be cut off; and loading a conduction control signal to the first scan line of the row to control the second transistor in the row to be conducted.

* * * * *